United States Patent
Li et al.

(10) Patent No.: US 9,026,869 B1
(45) Date of Patent: May 5, 2015

(54) IMPORTANCE-BASED DATA STORAGE VERIFICATION

(71) Applicant: Amazon Technologies, Inc., Reno, NV (US)

(72) Inventors: Yi Li, Vestal, NY (US); Danny Wei, Seattle, WA (US); Kerry Quintin Lee, Seattle, WA (US); Mahmood Miah, Seattle, WA (US); Nandakumar Gopalakrishnan, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 273 days.

(21) Appl. No.: 13/666,855

(22) Filed: Nov. 1, 2012

(51) Int. Cl.
*G06F 11/10* (2006.01)

(52) U.S. Cl.
CPC .......... *G06F 11/106* (2013.01); *G06F 11/1016* (2013.01); *G06F 11/1032* (2013.01)

(58) Field of Classification Search
CPC ........ G11C 29/56; G11C 29/48; G11C 29/44; G11C 29/50; H05K 999/99; G06F 11/106; G06F 11/1016; G06F 11/1032; G06F 2211/1088
See application file for complete search history.

(56) References Cited

U.S. PATENT DOCUMENTS

| | | | |
|---|---|---|---|
| 5,632,012 A * | 5/1997 | Belsan et al. | 714/6.12 |
| 6,629,273 B1 * | 9/2003 | Patterson | 714/718 |
| 7,434,012 B1 * | 10/2008 | Ives et al. | 711/159 |
| 7,734,867 B1 * | 6/2010 | Keeton et al. | 711/114 |
| 8,255,772 B1 * | 8/2012 | Foley | 714/764 |
| 2005/0028048 A1 * | 2/2005 | New et al. | 714/54 |
| 2005/0066254 A1 * | 3/2005 | Grainger et al. | 714/764 |
| 2006/0031722 A1 * | 2/2006 | Kolvick et al. | 714/52 |
| 2006/0090112 A1 * | 4/2006 | Cochran et al. | 714/737 |
| 2006/0129785 A1 * | 6/2006 | Ripberger | 711/173 |
| 2007/0050667 A1 * | 3/2007 | Zohar et al. | 714/6 |
| 2009/0070647 A1 * | 3/2009 | Allison et al. | 714/746 |
| 2011/0295815 A1 * | 12/2011 | Mandagere et al. | 707/690 |
| 2012/0059803 A1 * | 3/2012 | Nagpal et al. | 707/691 |
| 2013/0158973 A1 * | 6/2013 | Hsiong | 703/14 |

* cited by examiner

*Primary Examiner* — Albert Decady
*Assistant Examiner* — Enamul M Kabir
(74) *Attorney, Agent, or Firm* — Kilpatrick Townsend & Stockton LLP

(57) ABSTRACT

Methods and systems for detecting error in data storage entities based at least in part on importance of data stored in the data storage entities. In an embodiment, multiple verification passes may be performed on a data storage entity comprising one or more data blocks. Each data block may be associated with a probability indicating the likelihood that the data block is to be selected for verification. During each verification pass, a subset of the data blocks may be selected based at least in part on the probabilities associated with the data blocks. The probabilities may be adjusted, for example, at the end of a verification pass, based on importance factors such as usage and verification information associated with the data blocks. The probabilities may be updated to facilitate timely detection of important data blocks. Additionally, error mitigation and/or correction routines may be performed in light of detected errors.

28 Claims, 8 Drawing Sheets

IMPORTANCE-BASED DATA STORAGE VERIFICATION

BACKGROUND

Data storage media, such as hard disks, sometimes have errors due to write failures, physical damage to data storage media, deterioration of components of the storage media or other reasons. Some of these errors may remain latent until a particular portion of a data storage medium is accessed. To detect such storage media errors, a verification or "scrubbing" process may be employed to proactively verifies the integrity of stored data, for example, as a background process and/or on a periodic basis. Timely detection of such errors is often desirable, for example, to reduce the likelihood that correctable errors will accumulate into uncorrectable errors. However, with increasing capacity of data storage devices, it may take a long time to verify all data stored on a data storage device. Further, frequent data verification may impose system overhead such as interference with input/output (I/O) bandwidth, wear and tear to data storage devices and the like.

BRIEF DESCRIPTION OF THE DRAWINGS

Various embodiments in accordance with the present disclosure will be described with reference to the drawings, in which.

DETAILED DESCRIPTION

Figure 1:
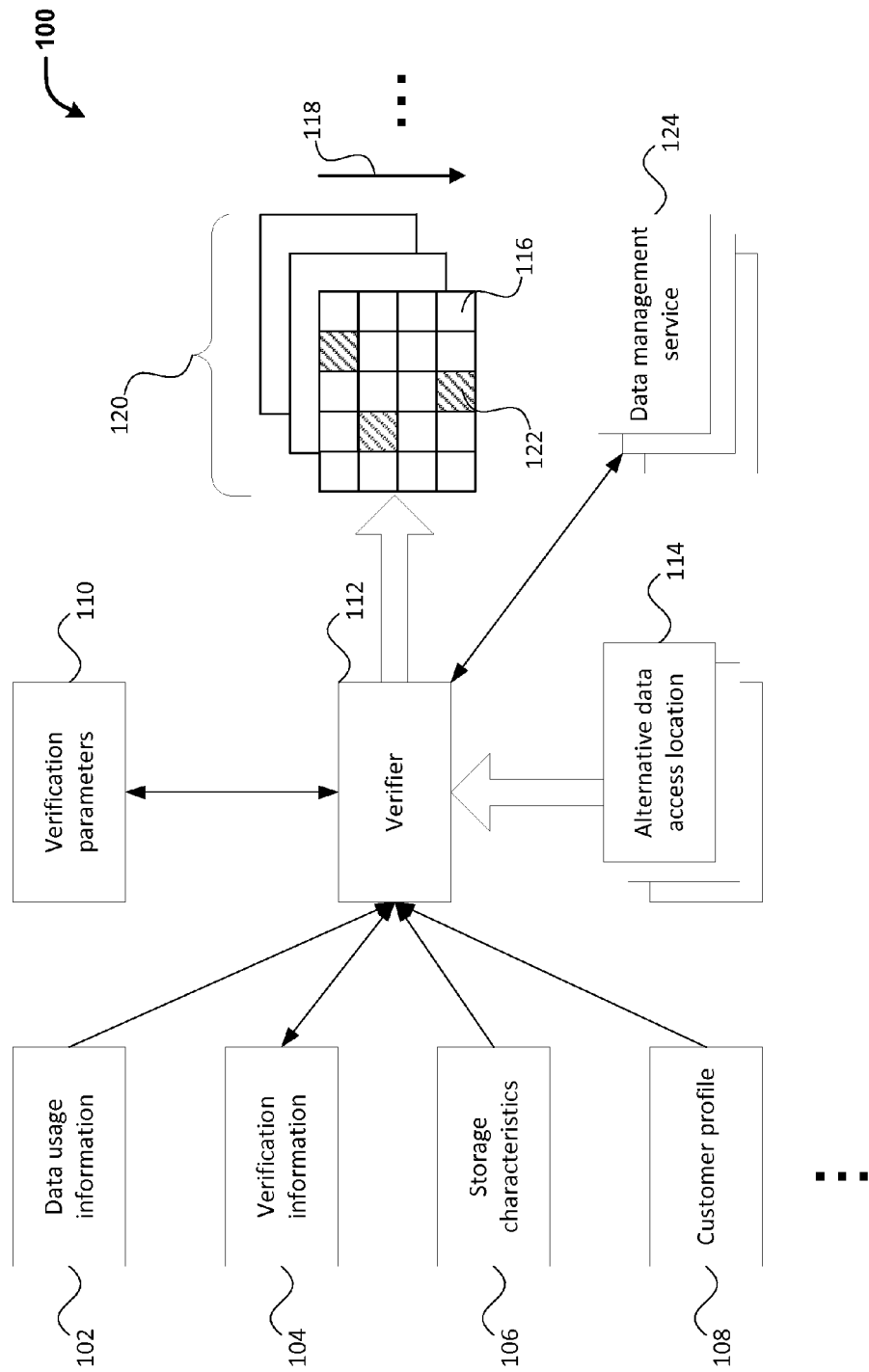
FIG. 1 illustrates an example implementation of data storage verification, in accordance with at least one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include systems and methods for detecting errors in data storage media by selectively verifying portions or blocks of data stored in the data storage entity based at least in part on importance of the data. As used herein, a data storage entity may include one or more data volumes, data storage servers, data storage devices, data centers, a portion thereof, or a combination thereof. In various embodiments, a data storage entity may be used by a computing resource service provider (hereinafter, "service provider") to store data that belongs to one or more customers of the computing resource service provider. In various embodiments, a data storage entity may comprise one or more data blocks. A data block, may be an addressable portion of a data storage entity that may be verified, for example, by a single read operation. For example, a data block may include one or more sectors of a hard disk drive, one or more blocks addressable using block level addressing (BLA).

Typically, a data storage entity may include many data blocks such that verification of all the data blocks may take a long time. To reduce the risk of accumulation of correctable errors during this time, a data storage entity may be verified in multiple verification passes, each of which verifies the integrity of only a subset of relatively important data blocks in the data storage entity. When the size of the subset is small relative to the size of the data storage entity, each pass may be performed in a relatively short period of time. During the verification passes, data blocks determined to be relatively more important are given priority and verified more quickly and/or frequently than other data blocks. Importance may refer to the relative priority of a data block for verification purposes. The more important a data block is determined to be, the more likely that the data block will be verified. The importance of a data block may be dynamically changing based at least in part on factors discussed below. For example, in some embodiments, the data blocks may be verified at the same time as the data blocks are being used by customers. Such changing customer usage may dynamically affect the importance associated with data blocks. Hence, the verification of the data blocks may be dynamically adjusted according to reflect such dynamically changing importance of the data blocks.

In some embodiments, importance factors may include usage information associated with the data blocks. Usage information may include the age of data (i.e., the time since the data was last written), data access (e.g., read/write) pattern over a period of time or other information on how the data is used. For example, in some embodiments, data blocks that have been written to recently written may be deemed to be more important than data blocks that have not been written to recently. In some cases, giving higher priority to recently written blocks may facilitate timely detection errors that are caused by write operations.

In some embodiments, importance factors may include one or more storage characteristics associated with a data storage entity or data stored thereon. For example, storage characteristics may include reliability, capacity, availability, geographic location, fault or isolation zone information and other characteristics of data storage entities. Data stored in a storage device with a high failure rate, for example, may be verified at a higher frequency than data stored in a more reliable storage device. Further, storage characteristics may include indication of whether storage space has been allocated, for example, in response to a request (e.g., by a customer of a service provider) to attach a data volume to a virtual computing instance such as a virtual machine. Data blocks that have been allocated, for example, may be determined to be more important than data that has not been allocated. Other storage characteristics may include whether, where and how data has been redundantly and/or persistently stored. In some cases, data that is redundantly stored, for example, using replication or other data redundancy encoding scheme (e.g., erasure code) may be deemed less important than data that is not redundantly stored since redundantly stored data may be recovered relatively easily if a data loss occurs. In other cases, data that is redundantly stored may be considered more important because the data may be more valuable to a customer than the data that is not redundantly and/or persistently stored (e.g., temporary data).

In some embodiments, importance factors may include verification information based on information derived from one or more verification passes. For example, verification information may include indication of whether a data block has been verified recently, whether an error is detected in a data block (hereinafter, "error block"), proximity of a data block to an error block, the time it takes to perform a particular verification pass or to verify a particular number of blocks and the like. In an embodiment, a data blocks located at and/or close to an error block are considered more important relative to other data blocks and hence more likely to be verified in a subsequent verification pass. Additionally, in some embodiments, importance factors may include profile information related to an entity (e.g., a customer of a service provider) that accesses data stored in a data storage entity. Such information may include customer account type, pricing and/or accounting information, service agreement, customer preference(s) and/or settings and other similar information. For example, a service provider may provide different data reliability guarantees to customers with different account types and/or different pricing options. Data under a high reliability guarantee may be more likely to be verified than data under a low reliability guarantee or no guarantee at all.

In some embodiments, the verification passes may be performed based on configurable information that may include one or more configurable parameters. Such configurable information may be stored in a configuration file, local or remote data stores or the like. For example, configurable information may include a time or frequency to perform one or more verification passes, a size of a data block, a rate at which data is verified and/or read, total amount of data verified in a pass, total amount of data on a data storage entity that is subject to verification, one or more weight values usable for calculating importance associated with data blocks and other information. Such configurable information may be predefined and/or updated dynamically (e.g., between verification passes), for example, to optimize performance characteristics of the system. For example, the rate at which data is verified may be relaxed when less computing resources, such as I/O bandwidth, memory, central processing unit (CPU) processing power, is available.

In some embodiments, information used to verify data blocks, such as importance factors and verification parameters as discussed above, may be provided or collected by a service provider, a customer or any other entities. For example, a service provider may collect information on how data is used (e.g., customer read/write patterns), whether a data volume is attached to or detached from a client instance (e.g., virtual machine instance), whether customer data has been snapshotted or otherwise redundantly stored, information about a customer that accesses the data and other information. In some embodiments, a service provider may provide a user interface such as a web interface, an application programming interface ("API") for a customer, system administrator or any other entity to specify information that may be used to determine the importance of customer data. For example, a customer may be allowed to designate one or more portions of data as critical to the customer. For another example, a customer may specify the level of data reliability and/or durability associated with a particular type or set of data.

In some embodiments, importance of a data block may be represented by a probability that indicates the likelihood that the data block will be verified. The higher the probability the more likely the data block may be selected for verification. During each pass, a subset of the data blocks may be selected to be verified based at least in part on the probabilities associated with the data blocks. In some embodiments, verification of a data block may include performing a read operation on the data block and confirming that the read operation is performed successfully. For example, one or more error-detection codes (e.g., parity bits, checksums, cyclic redundancy checks (CRCs)) associated with the read data may be verified. In other embodiments, verification of a data block may include instead of or in addition to checking an error-detection code, checking that that the data block stores specific kind of data, such as 0's.

In some embodiment, probabilities associated with at least some of the data blocks may be updated based at least in part on the relative important of some or all of the data blocks stored in the data storage entity and/or verification results of the verification passes during or between verification passes. For example, the probability associated with a data block that is verified in the current verification pass decrease while that the probability associated with an unverified data block may increase so that the unverified data block is more likely to be verified in a subsequent verification pass. In some embodiments, such probability updates may be based on statistical analysis historical data and/or failure characteristics of data storage entities. For example, such analysis may show that certain types of errors in a data storage entity tend to occur in clusters with certain failure characteristics. In such cases, probabilities of data blocks at or near a data block where an error is detected may increase more significantly than other data blocks to ensure that the data blocks at or near the error block are more likely to be verified later. In some embodiments, a weight value may be associated with each data block to indicate the relative importance of the data block based at least in part on the importance factors discussed above. The weight value associated with a data block may be fixed or it may vary over time as the relative importance of the data block may change. In such embodiments, the probability associated with a data block may be updated based at least in part on the current weight value for the data block.

In some embodiments, the verification passes are performed to ensure that substantially all of the data blocks are verified eventually. To this end, in an embodiment, the probabilities associated with data blocks may be updated using a zero-sum algorithm or a variation thereof. In such an embodiment, the total decrease in probabilities may be substantially the same as the total increase in probabilities such that the average probability for all the data blocks remains substantially the same before and after the update. In an illustrative embodiment, the probabilities of all verified blocks are redistributed across all data blocks in proportion to the weight values associated with the data blocks.

In some embodiments, when an error is detected, one or more mitigation measures may be taken to reduce the negative impact of the one or more errors. The mitigation measures may include, example, steps to limit further storage of data on a data storage entity where an error is detected. For example, a data storage entity (such as a data center, data storage server and the like) with a detected error may stop competing aggressively for mastership of data volumes, for example, by increasing the wait period and/or time limits for taking and/or keeping mastership of the volumes. For another example, the data storage entity may refuse to accept new volumes and/or entering into a degraded mode to facilitate the isolation and/or fixing of the error or to allow the system to fail in a graceful fashion. Such a drastic error mitigation measure may sometimes have a large-scale performance impact (e.g., reduced availability and/or throughput) and may require permission and/or evaluation from one or more load-balancing or throughput/rate control services before the measure may be taken. In various embodiments, error mitigation measures may be taken any time before or after an error is detected and may last for any length of time. For example, mitigation measures may be taken before or at the same time as the efforts are made to fix a detected error.

In some embodiments, when an error is detected, one or more error-correction measures may be taken to fix the error. For example, in an embodiment, an error block may be overwritten depending on whether the data block is allocated. If the data block is unallocated, the data block may be overwritten with specific data (e.g., zeros) or random data. Otherwise, if the data block is allocated, attempts may be made to retrieve an uncorrupted copy of the error block from one or more alternative data access locations (e.g., local or remote backup data stores) and store the data at the same or a different location as the error block. For example, an uncorrupted copy may be obtained from an update-to-date slave data storage entity if the error occurs in the master data storage entity. In some cases, data from a low latency data store may be transferred to a high durability data store to increase durability and reliability. In such cases, an uncorrupted copy may be obtained from the high durability data store if the error occurs in the low latency data store. In either case, the probabilities associated with surrounding blocks may be increased to facilitate the verification of those blocks later (e.g., in a subsequent verification pass). In some embodiments, if one or more error-correction measures discussed above fail to fix one or more detected errors or if the number of detected errors exceeds a predefined threshold number, the data storage entity may enter into a degraded mode and/or an error log/message may be provided to facilitate the isolation and/or correction of the detected errors or to allow the system to fail in a graceful fashion. In some embodiments, error-mitigation and/or error-correction measures may be taken within a predetermined period of time (e.g., 3 hours) from when the error is detected so as to prevent or reduce the accumulation of errors. Additionally, error mitigation and/or fixing may be performed by one or more entities (e.g., computer systems) that are the same or different from the entities perform error detection as described herein.

FIG. 1 illustrates an example implementation 100 of data storage verification, in accordance with at least one embodiment. In this example, one or more verifiers 112 may be configured to perform any of the error detection, error mitigation and/or error correction methods described herein on one or more data storage entities 120 (e.g., data storage device or a portion thereof). Each data storage entity 120 may comprise one or more data blocks 116. In various embodiments, a verifier 112 may include a service or process that is implemented by one or more physical and/or logical computer systems. For example, a verifier 112 may be implemented by software running on one or more data storage servers or by firmware running on one or more data storage devices.

In an illustrative embodiment, a verifier 112 may perform one or more verification passes 118 over a data storage entity 120. A verification pass 118 may be initiated by a computer system that implements the verifier 112, for example, on a periodic basis or by based on occurrence of an event, or in response to a request from an entity such as another service or service provider, a customer and the like. As described above, during a verification pass 118, a subset of data blocks 122 may be selected for verification. In some embodiments, the selection if the subset may be based at least in part on probabilities associated with the data blocks 116. The probabilities may be used to indicate relative verification priorities.

As described above, probabilities of the data blocks 116 may be updated (e.g., between two verification passes 118) to reflect changes in relative importance of the data blocks. Such changes in importance may in turn depend on a variety of factors such as data usage information 102 associated with the one or more data storage entities 120, verification information 104 for one or more verification passes, one or more storage characteristics 106 and customer profile information 108 as discussed herein. For example, data usage information 102 may include, among others, read/write access pattern associated with one or more data blocks or data storage entities. Verification information 104 may include historical and/or estimated verification-related data such as verification statuses of data blocks (e.g., whether a data block has been verified and if so, whether the verification is recent), locations and types of errors detected, previous or estimated time to perform a verification pass or to verify a certain number of data blocks and the like. For example, the verifier 112 may estimate and/or update the time to perform a full scan, e.g., in a log file, based at least in part on time to perform one or more verification passes. A full scan may include the verification of all verifiable data in a data storage entity and may include one or more verification passes. In some embodiments, verification information 104 may be used to adjust verification parameters 110, discussed below. For example, if the estimated time to perform a full scan is estimated to be too long, the rate at which data is verified may be increased, among other things, to fasten the verification process.

In some embodiments, storage characteristics 106 may include characteristics associated with a data storage entity such as failure characteristics, geographic location, isolation/availability zone information and characteristics associated with data stored in a data storage entity such as whether a data block has been allocated (e.g., attached as part of a data volume) for use by a customer of a service provider, whether a data block has been snapshotted, replicated or otherwise redundantly encoded and/or stored. Additionally, customer profile information 108 may include account type, pricing information, service agreement, customer preference(s) and/or settings and other information related to a customer that stores and/or uses data stored in a data storage entity 120. In a multi-tenant system, a data storage entity 120 may include data blocks that are accessed by one or more tenants or customers who may be associated with different profile information.

Furthermore, a verifier 112 may perform data verification based at least in part on one or more verification parameters 110. For example, Table 1 illustrates a list of example verification parameters, their default values and corresponding descriptions, in accordance with at least one embodiment. Some or all of the verification parameters 110 may be configurable by a verifier 112 or another entity such as a system administrator, a customer and the like, to control how the verifier 112 operates. The parameters listed in Table 1 should be taken as being illustrative in nature, and not limiting to the scope of the disclosure. Another embodiment may include more, less or different parameters than illustrated herein.

TABLE 1 illustrates a list of example verification parameters,
in accordance with at least one embodiment.

| Verification Parameter | Default Value | Description |
|---|---|---|
| read_blocksize_bytes | 1024 * 1024 | the size of a block to be read (bytes) |
| single_pass_seconds | 3600 | the time to perform a pass (seconds) |
| read_bytes_per_second | 10 * 1024 * 1024 | the configured minimum throttle (bytes/second) |
| size_storage_bytes | 12 * 1024 * 1024 * 1024 | size of the data storage media to be verified (bytes) |
| weight-written-allocated-not-verified | 5.0 | weight for blocks that were recently written to, are allocated, and not verified |
| weight-written-not-allocated-not-verified | 3.0 | weight for blocks that were recently written to, are not allocated, and not verified |
| weight-written-allocated-verified | 2.0 | weight for blocks that were recently written to, are allocated, and verified |
| weight-other | 1.0 | weight for every other type of block (e.g., not recently written to) |
| weight-error | 100.0 | weight for a block when an error is detected near it |
| recent-threshold-seconds | 3 * 3600 * 24 | the threshold value for determining whether something is "recent" |
| error_clustering_area_size_bytes | 1024 * 1024 * 1024 | size of the surrounding area near an error block, where data blocks in this area may be assigned weight-error. |
| normalization_deviation | 0.0001 | how much of a deviation from the expected probability is acceptable |

As illustrated above, verification parameters 110 may include a read_blocksize_bytes parameter, which specifies, in bytes, the size of a data block to be read. As discussed above, in some embodiments, verification of a data block may include reading the data block and verifying that the read operation is successful. For example, a read operation may include issuing a read command (e.g., a pread64 command in a C-based programming language), which reads a given number bytes and returns an error code if the read operation fails. In some embodiments, verification of a data block may include verifying one or more error-detection code (e.g., checksums, parity bits, CRC), performing a cryptographic operation (e.g., decryption) or otherwise processing the read data. For example, in a hard disk drive, each physical sector may comprise a sector header, a data portion and an error-detection code that is calculated based at least in part on the data. In this example, verification of a data block that includes one or more such sectors may include reading the one or more sectors and verifying the error-detection code associated with each of the sectors. In other embodiments, instead of or in addition to verifying an error-detection code of a disk sector, the sector header and/or data portion of the disk sector may be verified. As another example, data may be encrypted or otherwise encoded before being stored in a data storage entity. In such an example, verification of the data may include decrypting or otherwise decoding retrieved data.

In some embodiments, a verifier 112 may communicate with one or more data management services 124 to determine, for example, that certain data should be stored in certain areas of the data storage entity. For example, a data management service 124 may include an area cleaner service configured to zero-fill one or more data blocks, for example, after a data volume containing the data blocks is detached or de-allocated. In such an example, a verifier 112 may query a data management service 124 to determine whether one or more data blocks should contain specific data (e.g., zero-filled or random data). Based on a response from the data management service 124, the verifier 112 may determine whether the one or more data blocks indeed contain the specific data and if not, indicates the detection of an error (e.g., in an error message, log and the like).

As illustrated in Table 1, verification parameters 110 may include a single_pass_seconds parameter, which specifies, in seconds, an amount of time to perform a single verification pass. In an embodiment, this parameter may be used in combination with other parameters, such as read_bytes_per_second, to determine the amount of data that can be verified in a single pass. The read_bytes_per_second parameter may be used to refer to the minimum rate at which data is to be read during verification passes. Alternatively or additionally, a parameter may specify the maximum or average rate at which data is to be read. For example, assuming a single pass is to be performed in one hour (i.e., single_pass_seconds=3600) and a data read rate of 10 MB/second (i.e., read_bytes_per_second=10*1024*1024), the total amount of data that may be verified in a single verification pass may be calculated single_pass_seconds* read_bytes_per_second, or approximately 3600*10*1024*1024=36 GB. Given a data block size of 1 MB (i.e., read_blocksize_bytes=1024*1024), approximately single_pass_seconds*read_bytes_per_second/read_blocksize_bytes, or 36000 data blocks is expected to be verified in a single pass. In various embodiments, any of the verification parameters including their values may be configurable, for example, according to varying operational characteristics and/or performance requirements. For example, when I/O bandwidth is constrained such as during peak I/O traffic, read_bytes_per_second may be kept low to avoid significant competition for I/O bandwidth. In such cases, the amount of time to perform a single pass (i.e., single_pass_seconds) may need to be lengthened to perform a full scan.

As illustrated in Table 1, verification parameters 110 may include a size_storage_bytes parameter that specifies, in bytes, the total amount of data to be verified by a full scan and is typically associated with at least a portion of a data storage entity (e.g., hard disk drive, rack of disk drives, a platter of a hard disk drive). In some embodiments, size_storage_bytes may be used, in combination with other parameters such as read_bytes_per_second, to calculate the time it takes to perform a full scan of a data storage entity. For example, given the parameters as shown in Table 1, the total amount of time it takes to perform a full scan is approximately two weeks. Like other verification parameters, the size_storage_bytes parameter may be configurable.

As illustrated in Table 1, verification parameters 110 may include one or more weight values associated with different types of data blocks. The weight values may be used, for example, to calculate a probability assigned to a data block. In some embodiments, data blocks may be classified into different types based at least in part on importance factors such as discussed above. For example, as shown to Table 1, data blocks at and/or near an error block may be assigned a significant weight (weight–error=100.0. On the other hand, data blocks that are determined to be recently written to, allocated, and not verified may be assigned a less significant weight (e.g., weight-written-allocated-not-verified=5.0). As discussed above, the determination may be based on data usage information 102 (e.g., whether a data block has been recently written to), storage characteristics 106 (e.g., whether a data block is allocated) and verification information 104 (e.g., whether a data block is recently verified). Next, data blocks that are determined to be recently written to, unallocated, and not verified may be assigned a lower weight value (e.g., weight-written-not-allocated-not-verified=3.0). For example, such data blocks may include those that written (e.g., zero-filled) to, for example, by a data management service 124, an error detection and/or correction routine, but not allocated for use by a customer. Data blocks that are determined to be recently written to, allocated, and verified may be assigned an even lower weight value (e.g., weight-written-allocated-verified=2.0). Finally, a data block may be assigned a default weight value if it does not fall into any of the above categories (e.g., for a data block that is has not been written to). In various embodiments, verification parameters 110 may include more, less and/or different weight values than illustrated here to reflect ranking of based on any factors such as the importance factors described herein. For example, a data block that has been snapshotted, replicated or otherwise redundantly stored may be assigned a lower weight value than a data block that has not been redundantly stored. For another example, a data storage entity may include data blocks that belong to different allocated data storage volumes, each data storage volume may be assigned a weight value depending on the type or tier of the data storage volume. As another example, a data block used to store data for one customer or a group of customers may be assigned a different weight value from a data block that is used to store data for another customer or another group of customers.

As illustrated in Table 1, verification parameters 110 may include a threshold value (e.g., recent-threshold-seconds=3*3600*24 seconds, or 3 days) for determining whether an action or status (e.g., data access or verification status) associated with a data block is "recent." As another example, verification parameters 110 may include a size of (e.g., error_clustering_area_size_bytes=1 GB) of an area surrounding an error block on which future verification should be focused on. Data blocks falling within this area may, for example, be assigned significant weight (e.g., weight-error). In some embodiments, instead of or in addition to specifying the size of such an area, the area may be expressed as one or more radii from an error block, each of the radii may be associated with a weight value. For example, a data block that is within a radius of an error block may be assigned a weight value of 100; a data block that is between 1 MB and 5 MB from the error block may be assigned a weight value of 60; and so on. As illustrated in Table 1, verification parameters 110 may include a normalization_deviation parameter that specifies an acceptable level of deviation from an expected probability value. In an embodiment, if the sum of probabilities of all data blocks deviates from an expected probability value by greater than normalization_deviation, the probabilities of the data blocks are renormalized.

In various embodiments, some or all of verification parameters 110, such as those illustrated in Table 1 may be updated by the verifier 112 or by system administrator, customer or another service or process, for example, via an API. Such updates may performed for a particular verification pass or a full scan, for a particular data storage entity and the like and the update may be based on operational requirements, performance characteristics, statistical analysis of historical data such as verification information, usage data and the like, and other factors. For example, error clustering area size may different for different data storage devices based at least in part on an analysis of failure characteristic of the data storage device. For another example, the rate at which data is verified may be adjusted between verification passes based at least in part on the currently available computing resources.

In some embodiments, verifier 112 may perform routines or steps such as described herein to corrected an error that is detected. For example, verifier 112 may attempt to recover data stored in one or more error blocks from one or more alternative data access locations 114 (e.g., slave disk drive, local or remote data stores). As discussed above, verifier 112 may also perform one or more error mitigation measures (e.g., limiting the storage of new data to a data storage entity that contains an error) instead of or in addition to error mitigation measures.

Figure 2:
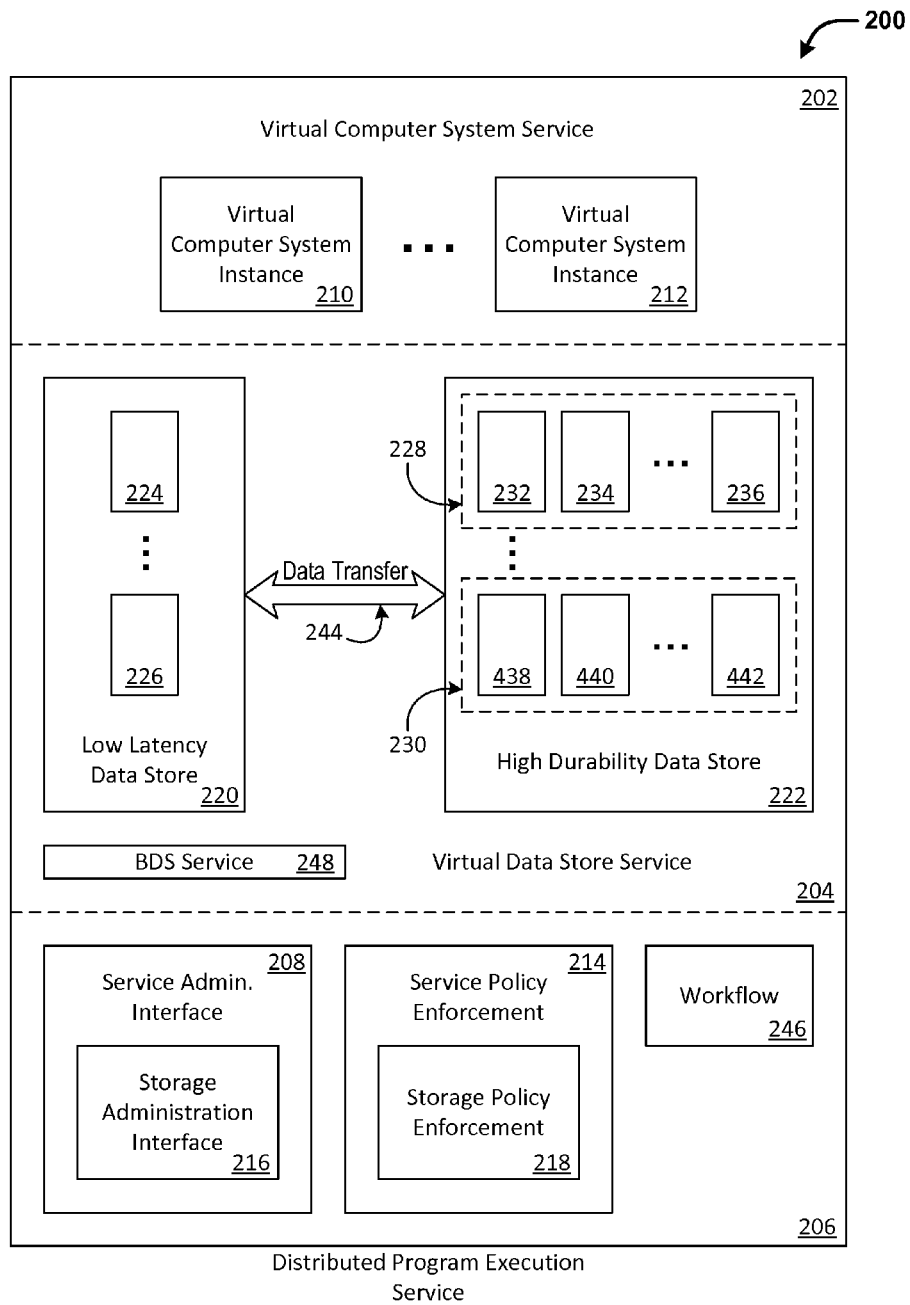
FIG. 2 illustrates aspects of an example distributed program execution service where methods described herein may be implemented, in accordance with at least one embodiment.

In at least one embodiment, one or more aspects of the environment 100 may incorporate and/or be incorporated into a distributed program execution service. FIG. 2 illustrates aspects of an example distributed program execution service 200 where methods described herein may be implemented, in accordance with at least one embodiment. The distributed program execution service 200 provides virtualized computing services, including a virtual computer system service 202 and a virtual data store service 204, with a wide variety of computing resources interlinked by a relatively high speed data network. Such computing resources may include processors such as central processing units (CPUs), volatile storage devices such as random access memory (RAM), nonvolatile storage devices such as flash memory, hard drives and optical drives, servers such as web server and application server, one or more data stores, as well as communication bandwidth in the interlinking network. The computing resources managed by the distributed program execution service 200 are not shown explicitly in FIG. 2 because it is an aspect of the distributed program execution service 200 to emphasize an independence of the virtualized computing services from the computing resources that implement them.

The distributed program execution service 200 may utilize the computing resources to implement the virtualized computing services at least in part by executing one or more programs, program modules, program components and/or programmatic objects (collectively, "program components") including and/or compiled from instructions and/or code specified with any suitable machine and/or programming language. For example, the computing resources may be allocated, and reallocated as necessary, to facilitate execution of the program components, and/or the program components may be assigned, and reassigned as necessary, to the computing resources. Such assignment may include physical relocation of program components, for example, to enhance execution efficiency. From a perspective of a user of the virtualized computing services, the distributed program execution service 200 may supply computing resources elastically and/or on-demand, for example, associated with a per resource unit commodity-style pricing plan.

The distributed program execution service 200 may further utilize the computing resources to implement a service control plane 206 configured at least to control the virtualized computing services. The service control plane 206 may include a service administration interface 208. The service administration interface 208 may include a Web-based user interface configured at least to enable users and/or administrators of the virtualized computing services to provision, de-provision, configure and/or reconfigure (collectively, "provision") suitable aspects of the virtualized computing services. For example, a user of the virtual computer system service 202 may provision one or more virtual computer system instances 210, 212. The user may then configure the provisioned virtual computer system instances 210, 212 to execute the user's application programs. The ellipsis between the virtual computer system instances 210 and 212 indicates that the virtual computer system service 202 may support any suitable number (e.g., thousands, millions, and more) of virtual computer system instances although, for clarity, only two are shown.

The service administration interface 208 may further enable users and/or administrators to specify and/or re-specify virtualized computing service policies. Such policies may be maintained and enforced by a service policy enforcement component 214 of the service control plane 206. For example, a storage administration interface 216 portion of the service administration interface 208 may be utilized by users and/or administrators of the virtual data store service 204 to specify virtual data store service policies to be maintained and enforced by a storage policy enforcement component 218 of the service policy enforcement component 214. Various aspects and/or facilities of the virtual computer system service 202 and the virtual data store service 204 including the virtual computer system instances 210, 212, the low latency data store 220, the high durability data store 222, and/or the underlying computing resources may be controlled with interfaces such as application programming interfaces (APIs) and/or Web-based service interfaces. In at least one embodiment, the control plane 206 further includes a workflow component 246 configured at least to interact with and/or guide interaction with the interfaces of the various aspects and/or facilities of the virtual computer system service 202 and the virtual data store service 204 in accordance with one or more workflows.

In at least one embodiment, service administration interface 208 and/or the service policy enforcement component 214 may create, and/or cause the workflow component 246 to create, one or more workflows that are then maintained by the workflow component 246. Workflows, such as provisioning workflows and policy enforcement workflows, may include one or more sequences of tasks to be executed to perform a job, such as provisioning or policy enforcement. A workflow, may not be the tasks themselves, but a task control structure that may control flow of information to and from tasks, as well as the order of execution of the tasks it controls. For example, a workflow may be considered a state machine that can manage and return the state of a process at any time during execution. Workflows may be created from workflow templates. For example, a provisioning workflow may be created from a provisioning workflow template configured with parameters by the service administration interface 208. As another example, a policy enforcement workflow may be created from a policy enforcement workflow template configured with parameters by the service policy enforcement component 214.

The workflow component 246 may modify, further specify and/or further configure established workflows. For example, the workflow component 246 may select particular computing resources of the distributed program execution service 200 to execute and/or be assigned to particular tasks. Such selection may be based at least in part on the computing resource needs of the particular task as assessed by the workflow component 246. As another example, the workflow component 246 may add additional and/or duplicate tasks to an established workflow and/or reconfigure information flow between tasks in the established workflow. Such modification of established workflows may be based at least in part on an execution efficiency analysis by the workflow component 246. For example, some tasks may be efficiently performed in parallel, while other tasks depend on the successful completion of previous tasks.

The virtual data store service 204 may include multiple types of virtual data store such as a low latency data store 220 and a high durability data store 222. For example, the low latency data store 220 may maintain one or more data sets 224, 226 which may be read and/or written (collectively, "accessed") by the virtual computer system instances 210, 212 with relatively low latency. The ellipsis between the data sets 224 and 226 indicates that the low latency data store 220 may support any suitable number (e.g., thousands, millions, and more) of data sets although, for clarity, only two are shown. For each data set 224, 226 maintained by the low latency data store 220, the high durability data store 222 may maintain a set of captures 228, 230. Each set of captures 228, 230 may maintain any suitable number of captures 232, 234, 236 and 238, 240, 242 of its associated data set 224, 226, respectively, as indicated by the ellipses. Each capture 232, 234, 236 and 238, 240, 242 may provide a representation of the respective data set 224 and 226 at particular moment in time. Such captures 232, 234, 236 and 238, 240, 242 may be utilized for later inspection including restoration of the respective data set 224 and 226 to its state at the captured moment in time. Although each component of the distributed program execution service 200 may communicate utilizing the underlying network, data transfer 244 between the low latency data store 220 and the high durability data store 222 is highlighted in FIG. 2 because the contribution to utilization load on the underlying network by such data transfer 244 can be significant.

For example, the data sets 224, 226 of the low latency data store 220 may be virtual disk files (i.e., file(s) that can contain sequences of bytes that represents disk partitions and file systems) or other logical volumes. The low latency data store 220 may include a low overhead virtualization layer providing access to underlying data storage hardware. For example, the virtualization layer of the low latency data store 220 may be low overhead relative to an equivalent layer of the high durability data store 222. Systems and methods for establishing and maintaining low latency data stores and high durability data stores in accordance with at least one embodiment are known to those of skill in the art, so only some of their features are highlighted herein. In at least one embodiment, the sets of underlying computing resources allocated to the low latency data store 220 and the high durability data store 222, respectively, are substantially disjoint. In a specific embodiment, the low latency data store 220 could be a Storage Area Network target or the like. In this exemplary embodiment, the physical computer system that hosts the virtual computer system instance 210, 212 can send read/write requests to the SAN target.

The low latency data store 220 and/or the high durability data store 222 may be considered non-local and/or independent with respect to the virtual computer system instances 210, 212. For example, physical servers implementing the virtual computer system service 202 may include local storage facilities such as hard drives. Such local storage facilities may be relatively low latency but limited in other ways, for example, with respect to reliability, durability, size, throughput and/or availability. Furthermore, data in local storage allocated to particular virtual computer system instances 210, 212 may have a validity lifetime corresponding to the virtual computer system instance 210, 212, so that if the virtual computer system instance 210, 212 fails or is de-provisioned, the local data is lost and/or becomes invalid. In at least one embodiment, data sets 224, 226 in non-local storage may be efficiently shared by multiple virtual computer system instances 210, 212. For example, the data sets 224, 226 may be mounted by the virtual computer system instances 210, 212 as virtual storage volumes.

Data stores in the virtual data store service 204, including the low latency data store 220 and/or the high durability data store 222, may be facilitated by and/or implemented with a block data storage (BDS) service 248, at least in part. The BDS service 248 may facilitate the creation, reading, updating and/or deletion of one or more block data storage volumes, such as virtual storage volumes, with a set of allocated computing resources including multiple block data storage servers. A block data storage volume, and/or the data blocks thereof, may be distributed and/or replicated across multiple block data storage servers to enhance volume reliability, latency, durability and/or availability. As one example, the multiple server block data storage systems that store block data may in some embodiments be organized into one or more pools or other groups that each have multiple physical server storage systems co-located at a geographical location, such as in each of one or more geographically distributed data centers, and the program(s) that use a block data volume stored on a server block data storage system in a data center may execute on one or more other physical computing systems at that data center.

The BDS service 248 may facilitate and/or implement local caching of data blocks as they are transferred through the underlying computing resources of the distributed program execution service 200 including local caching at data store servers implementing the low latency data store 220 and/or the high durability data store 222, and local caching at virtual computer system servers implementing the virtual computer system service 202. In at least one embodiment, the high durability data store 222 is an archive quality data store implemented independent of the BDS service 248. The high durability data store 222 may work with sets of data that are large relative to the data blocks manipulated by the BDS service 248. The high durability data store 222 may be implemented independent of the BDS service 248. For example, with distinct interfaces, protocols and/or storage formats.

Each data set 224, 226 may have a distinct pattern of change over time. For example, the data set 224 may have a higher rate of change than the data set 226. However, in at least one embodiment, bulk average rates of change insufficiently characterize data set change. For example, the rate of change of the data set 224, 226 may itself have a pattern that varies with respect to time of day, day of week, seasonally including expected bursts correlated with holidays and/or special events, and annually. Different portions of the data set 224, 266 may be associated with different rates of change, and each rate of change "signal" may itself be composed of independent signal sources, for example, detectable with Fourier analysis techniques. Any suitable statistical analysis techniques may be utilized to model data set change patterns including Markov modeling and Bayesian modeling.

As described above, an initial capture 232 of the data set 224 may involve a substantially full copy of the data set 224 and transfer 244 through the network to the high durability data store 222 (may be a "full capture"). In a specific example, this may include taking a snapshot of the blocks that make up a virtual storage volume. Data transferred between the low latency data store 220 and high durability data store 222 may be orchestrated by one or more processes of the BDS service 248. As another example, a virtual disk (storage volume) may be transferred to a physical computer hosting a virtual computer system instance 210. A hypervisor may generate a write log that describes the data and location where the virtual computer system instance 210 writes the data. The write log may then be stored by the high durability data store 222 along with an image of the virtual disk when it was sent to the physical computer.

The data set 224 may be associated with various kinds of metadata. Some, none or all of such metadata may be included in a capture 232, 234, 236 of the data set 224 depending on the type of the data set 224. For example, the low latency data store 220 may specify metadata to be included in a capture depending on its cost of reconstruction in a failure recovery scenario. Captures 234, 236 beyond the initial capture 232 may be "incremental", for example, involving a copy of changes to the data set 224 since one or more previous captures. Changes to a data set may also be recorded by a group of differencing virtual disks which each comprise a set of data blocks. Each differencing virtual disk may be a parent and/or child differencing disk. A child differencing disk may contain data blocks that are changed relative to a parent differencing disk. Captures 232, 234, 236 may be arranged in a hierarchy of classes, so that a particular capture may be incremental with respect to a sub-hierarchy of capture classes (e.g., a capture scheduled weekly may be redundant with respect to daily captures of the past week, but incremental with respect to the previous weekly capture). Depending on the frequency of subsequent captures 234, 236, utilization load on the underlying computing resources can be significantly less for incremental captures compared to full captures.

For example, a capture 232, 234, 236 of the data set 224 may include read access of a set of servers and/or storage devices implementing the low latency data store 220, as well as write access to update metadata, for example, to update a data structure tracking "dirty" data blocks of the data set 224. For the purposes of this description, data blocks of the data set 224 are dirty (with respect to a particular class and/or type of capture) if they have been changed since the most recent capture (of the same class and/or type). Prior to being transferred 244 from the low latency data store 220 to the high durability data store 222, capture 232, 234, 236 data may be compressed and/or encrypted by the set of servers. At the high durability data store 222, received capture 232, 234, 236 data may again be written to an underlying set of servers and/or storage devices. Thus each capture 232, 234, 236 involves a load on finite underlying computing resources including server load and network load. It should be noted that, while illustrative embodiments of the present disclosure discuss storage of captures in the high durability data store 222, captures may be stored in numerous ways. Captures may be stored in any data store capable of storing captures including, but not limited to, low-latency data stores and the same data stores that store the data being captured.

Captures 232, 234, 236 of the data set 224 may be manually requested, for example, utilizing the storage administration interface 216. In at least one embodiment, the captures 232, 234, 236 may be automatically scheduled in accordance with a data set capture policy. Data set capture policies in accordance with at least one embodiment may be specified with the storage administration interface 216, as well as associated with one or more particular data sets 224, 226. The data set capture policy may specify a fixed or flexible schedule for data set capture. Fixed data set capture schedules may specify captures at particular times of day, days of the week, months of the year, and/or any suitable time and date. Fixed data set capture schedules may include recurring captures (e.g., every weekday at midnight, every Friday at 2 am, 4 am every first of the month) as well as one-off captures.

Figure 3:
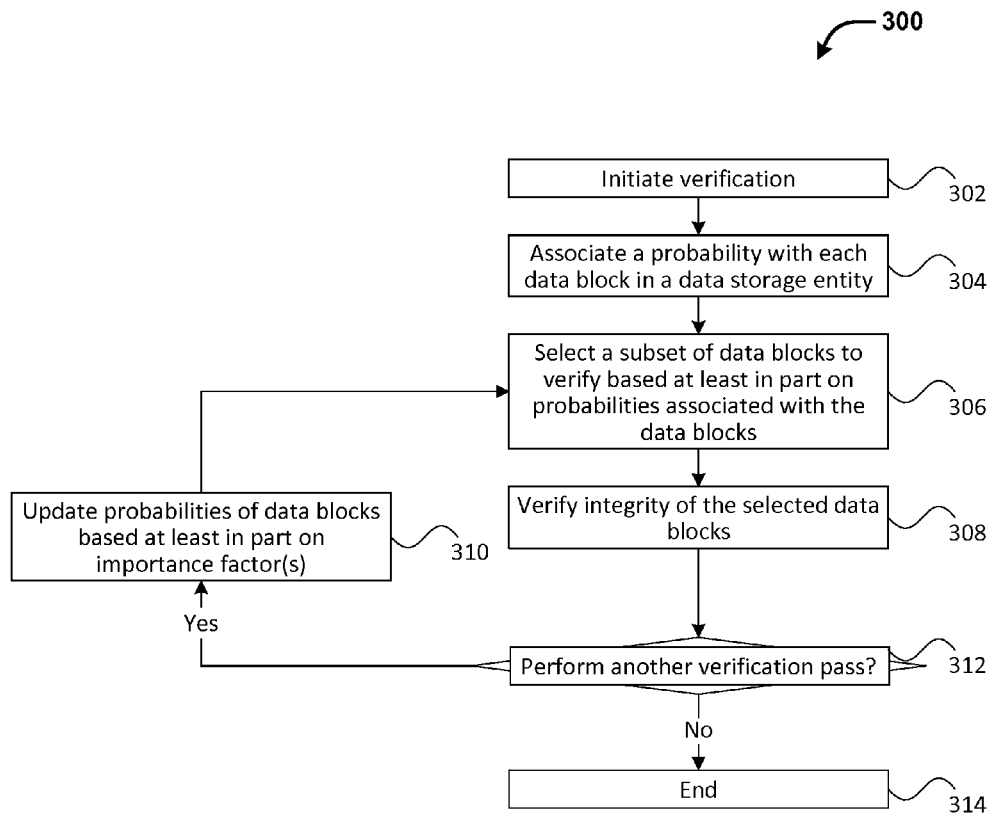
FIG. 3 illustrates an example process for detecting errors in a data storage entity, in accordance with at least one embodiment.

FIG. 3 illustrates an example process 300 for detecting errors in a data storage entity, in accordance with at least one embodiment. Some or all of the process 300 (or any other processes described herein, or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The order in which the operations are described is not intended to be construed as a limitation, and any number of the described operations can be combined in any order and/or in parallel to implement the processes. In some embodiments, process 300 may be implemented by one or more verifiers 112 shown in FIG. 1 and/or one or more components of a distributed program execution service 200 shown in FIG. 2.

In some embodiments, process 300 includes initiating 302 the verification process. In some embodiments, the verification may be initiated in response to a request to verify integrity of a data storage entity. In some embodiments, verification may be initiated by a system administrator, a customer, a service or computer system. Such verification may be initiated via an API, triggered by the occurrence of one or more predefined events, based on a predetermined schedule and/or configurable information or any other mechanisms. In some embodiments, initiation of verification may include initializing aspects of the verification process based on configurable verification parameters such as discussed in connection with FIG. 1. As discussed above, the verification process may be initiated and run at the same time the data blocks are being used, for example, by customers.

The process 300 may include associating an initial probability with each data block in the data storage entity to be verified. As discussed above, the probability may indicate the likelihood that given data block will be verified during a verification pass. Generally, data blocks may be assigned probabilities based at least in part on initial weight values that may be assigned to the data blocks. The weight values may be determined based at least in part on importance factors discussed above. In some cases, the distribution of probabilities across all data blocks may be uniform, i.e., each data block is assigned the same initial probability. In other cases, the distribution of probabilities may be non-uniform. For example, in an embodiment, each data block is assigned a probability that equal to the proportion of the data storage entity that is expected to be verified in a single verification pass. For example, using the parameters listed in Table 1, the initial probability for each data block may be set too:

(single_pass_seconds*read_bytes_per_second)/ size_storage_bytes

Based at least in part on the probabilities associated with the data blocks, the process 300 may include selecting 306 a subset of data blocks to verify in a particular verification pass. The higher the probability associated with a data block, the more likely the data block will be selected for verification. In some embodiments, the selection 306 may be based at least in part on one or more random or pseudo-random numbers between 0 and 1 and a probability distribution according to the probabilities associated with the data blocks. The probability distribution may be uniform or non-uniform. For example, according to at least one embodiment, a random or pseudo-random number of 0.74 may lead to the selection of data block 4, given the example distribution of probabilities as shown in Table 2 below.

TABLE 2 illustrates an example probability distribution among data blocks.

| Data block | 1 | 2 | 3 | 4 | 5 |
|---|---|---|---|---|---|
| Probability | 10% | 20% | 30% | 20% | 20% |
| Range | 0.0-0.1 | 0.1-0.3 | 0.3-0.6 | 0.6-0.8 | 0.8-1.0 |

In some embodiments, each of selected data blocks may be verified 308 to ensure integrity of data stored in the data block. For example, in an embodiment, verification 308 of a data block may include reading the data block and confirming that no read error results from the read operation. As discussed above, errors may occur due to write failures, corruption or malfunction of hardware components and other reasons. In some embodiments, separately from or as part of the read operation, an error-detection code of data stored in a data block may be verified. In other embodiments, read data may be examined to determine whether specific data (e.g., zeros) is stored. In yet some other embodiments, read data may be further processed (e.g., decoded, decrypted) as part of the verification. In some embodiments, the result of verification (e.g., whether an error is detected in a data block) may be recorded (e.g., in a file, a local or remote data store and the like).

In some embodiments, process 300 may include determining 312 whether to perform addition verification pass(es). In some embodiments, one or more verification passes may be performed repeatedly on a data storage entity until a full scan is achieved, some percentage (e.g., 80%) of the data storage entity has been verified, certain number of verification passes have been performed, certain number of errors have been detected, certain time has elapsed and/or until the satisfaction of some other configurable conditions. In such embodiments, determining 112 whether to perform the next verification pass may include checking whether such a condition is met (e.g., that all data blocks have been verified).

If it is determined that another verification pass is to be performed, process 300 may include updating 310 one or more probabilities associated with one or more data blocks based at least in part on the importance factors discussed in connection with FIG. 1. In particular, probabilities associated with data blocks may be adjusted between verification pass to reflect changes in relative importance of the data blocks. For example, probabilities associated with unverified data blocks may increase relative to verified data blocks to facilitate the likelihood that the unverified data blocks will be verified in a subsequent verification pass. For another embodiments, probabilities at and/or surrounding an error block may increase so that they are more likely to be verified next in cases where errors occur in clusters. In some embodiments, the relative importance of data blocks may be dynamically changing as the data blocks are dynamically accessed and used, for example, by customers. Once probabilities are updated, the process 300 may include performing a new verification pass starting with the selection 306 of data blocks to verify based at least in part on the updated probabilities. Otherwise, if it is determined that another verification pass is not to be performed (e.g., because a full scan is achieved or too many errors have been detected), process 300 may end 314.

In various embodiments, any error mitigation and/or correction operations, discussed in more detail in connection with FIG. 7, may be performed in connection with process 300. For example, such operations may be performed after detection of a single error or a group of errors, within a configurable time of the detection of error(s), between or during the verification passes or at any suitable point in time.

Figure 4:
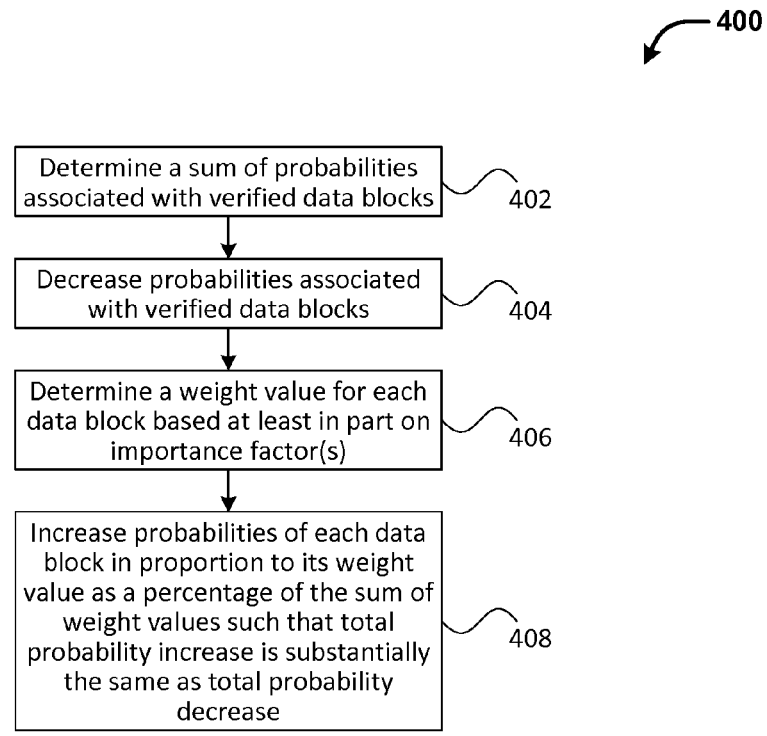
FIG. 4 illustrates an example process for updating probabilities associated with data blocks, in accordance with at least one embodiment.

FIG. 4 illustrates an example process 400 for updating probabilities associated with data blocks, in accordance with at least one embodiment. In particular, process 400 illustrates updating probabilities between verification passes according to a zero-sum algorithm or a variant thereof. That is, the total increase in probabilities is substantially the same as the total decrease in probabilities. In other words, the average probability associated with each data block remains substantially the same before and after the update. In some embodiments, process 400 may be implemented by one or more verifiers 112 as shown in FIG. 1 and/or one or more components of a distributed program execution service 200 as shown in FIG. 2. In some embodiments, process 400 may be performed at the end of a verification pass as described in connection with FIG. 3.

To start with, process 400 may include determining 402 a sum of probabilities associated with data blocks that have been verified during a verification pass. Next, probabilities associated with the verified data blocks may be decreased 404 by a specific amount. For example, in an embodiment, the probability decrease for a verified data block is equal to the probability associated with the data block before the decrease (i.e., the probability after the decrease is zero). A weight value for each data block (including verified and unverified data blocks) may be determined 406 based at least in part on one or more importance factors discussed connection with FIG. 1. In various embodiments, the weight value may or may not be recalculated based on current information. Based at least in part on the weight values, the probability associated with each data block may be increased 408 in proportion to its weight value as a percentage of the sum of weight values such that the total increase in probabilities is substantially the same as the total decrease in the probabilities. In other words, the total net probability decrease for verified blocks is spread among all the unverified data blocks. The probability increase of a given data block may be calculated by the following formula:

$$\frac{weight\_of\_block}{sum\_of\_weights\_of\_all\_blocks} \cdot sum\_of\_decrease\_of\_all\_verified\_blocks$$

where weight_of_block denotes the weight of the given data block, sum_of_weights_of _all_blocks denotes the sum of weight values for all the data blocks and sum_of_decrease_ of_all_verified_blocks denotes the sum of decrease in probabilities for all the verified blocks at step 404 of process 400. In the case where probabilities of all the verified blocks are reset to zero, sum_of_decrease_of_all_verified_blocks is equal to the sum of probabilities of all verified blocks before the reset.

Figure 5:
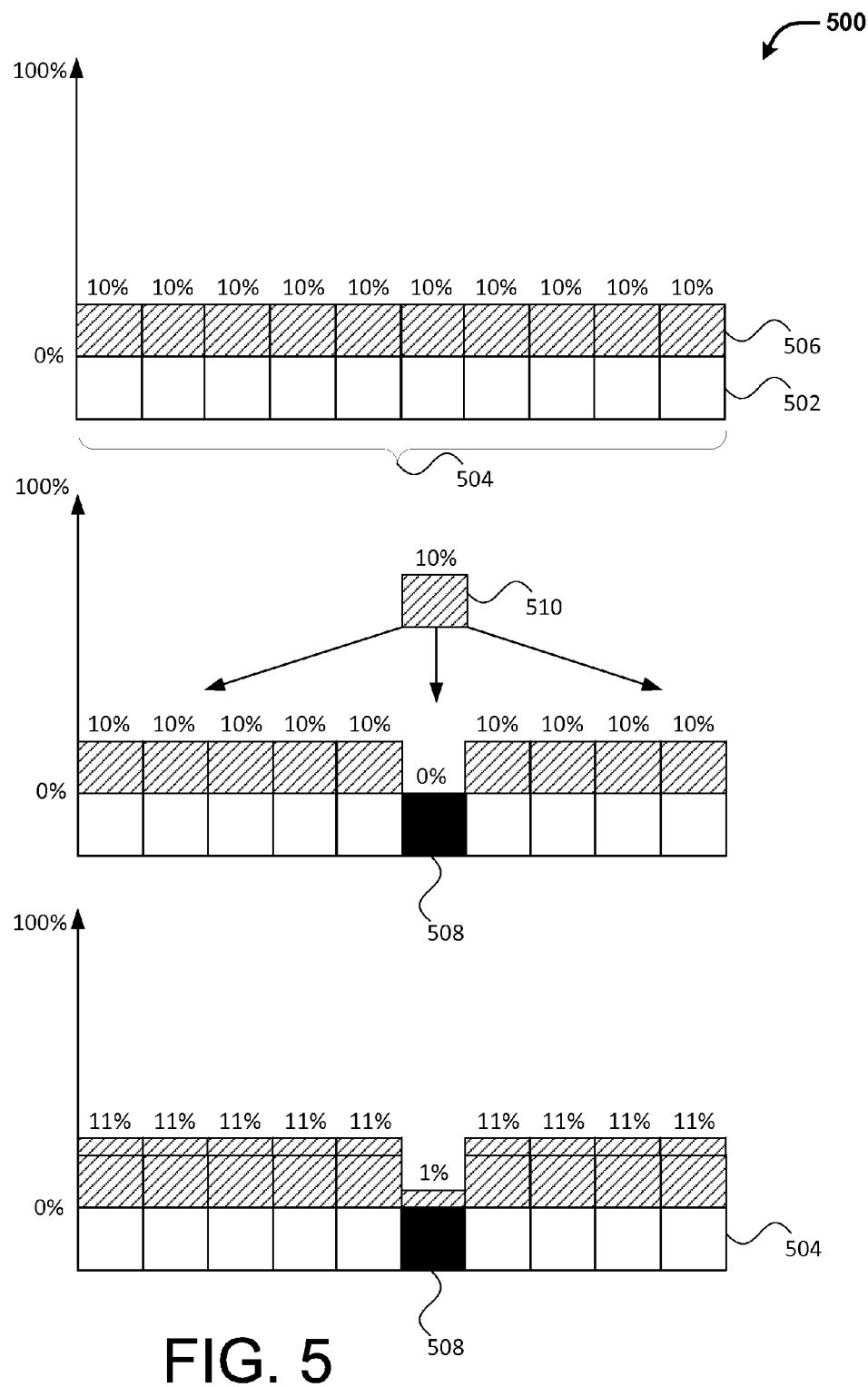
FIG. 5 depicts an example illustration of updating probabilities associated with data blocks, in accordance with at least one embodiment.

FIG. 5 depicts an example illustration 500 of updating probabilities associated with data blocks, in accordance with at least one embodiment. In this example, data storage entity 504 contains ten data blocks 502, each of which is associated a probability 506 of 10%. Assuming that only data block 508 is selected for verification during a verification pass and probabilities of verified data blocks are reset to zero, FIG. 5 shows the redistribution of the total probability 510 of verified block 508 across all the data blocks (including the reset verified block 508) according to a zero-sum algorithm as described in FIG. 4 given a uniform distribution of weights for all data blocks (i.e., all data blocks have the same weight value). In this case, the probability increase for each data block is 1%. Accordingly, the updated probability for the verified block 508 is now 1% and the updated probability for each of the unverified blocks is increased to 11%. Based on the updated probabilities, unverified data blocks are more likely, relative to the verified data block, to be verified in the next verification pass.

Figure 6:
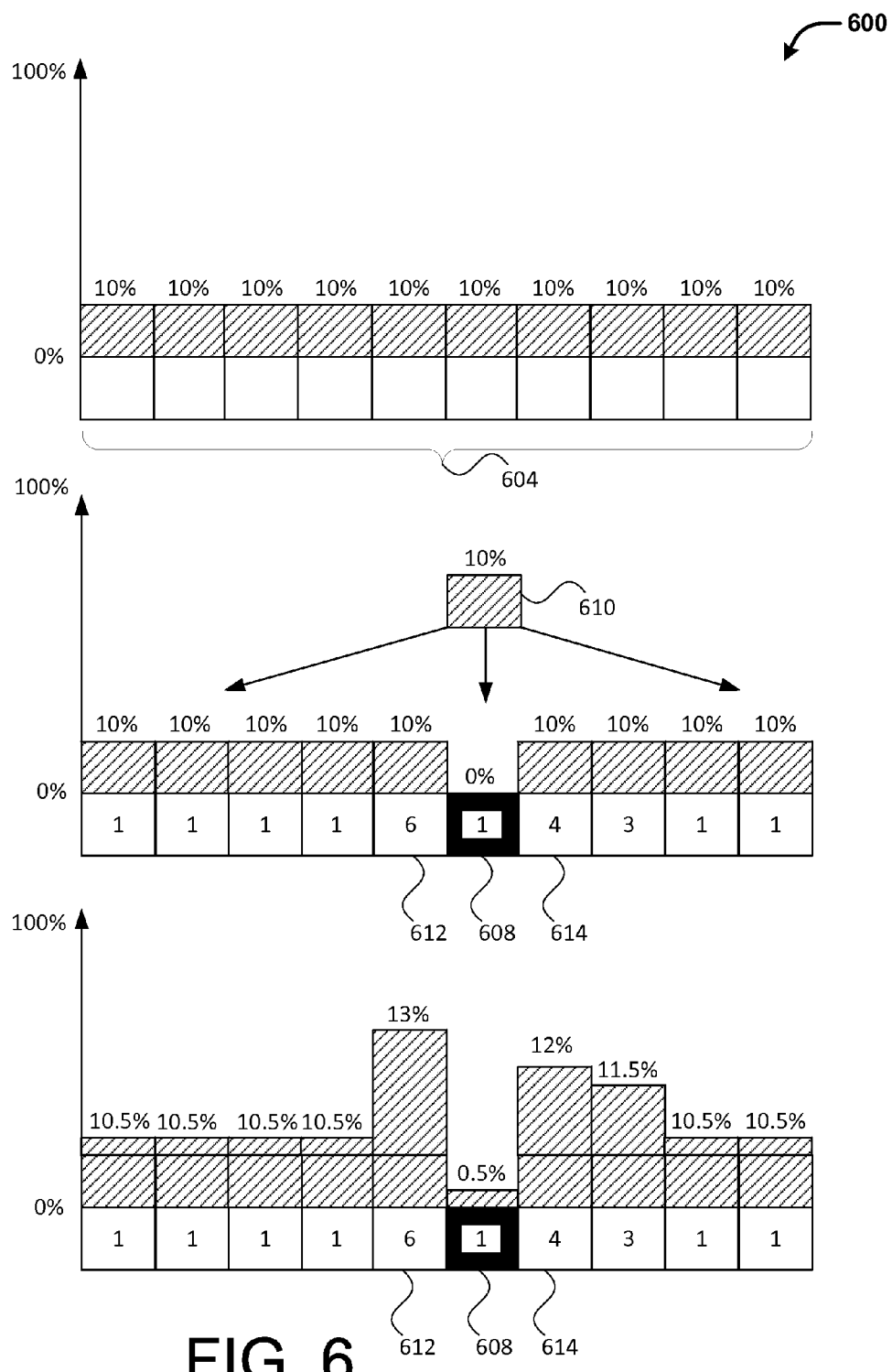
FIG. 6 depicts an example illustration of updating probabilities associated with data blocks, in accordance with at least one embodiment.

FIG. 6 depicts another example illustration 600 of updating probabilities associated with data blocks, in accordance with at least one embodiment. This example is similar to that illustrated by FIG. 5 except with a non-uniform distribution of weight values across all data blocks. As such, the probability of the verified data block 608 is redistributed across all the data blocks in a non-uniform fashion. Further, because the probability increase are distributed in proportion weight values, data blocks with higher weight values get a higher increase in probabilities. For example, the probability increase for block 612, with a weight value 6, is (10%*6)/(1+ 1+1+1+6+1+4+3+1+1)=3%, higher than the probability increase for block 614, which has a lower weight value of 4.

Figure 7:
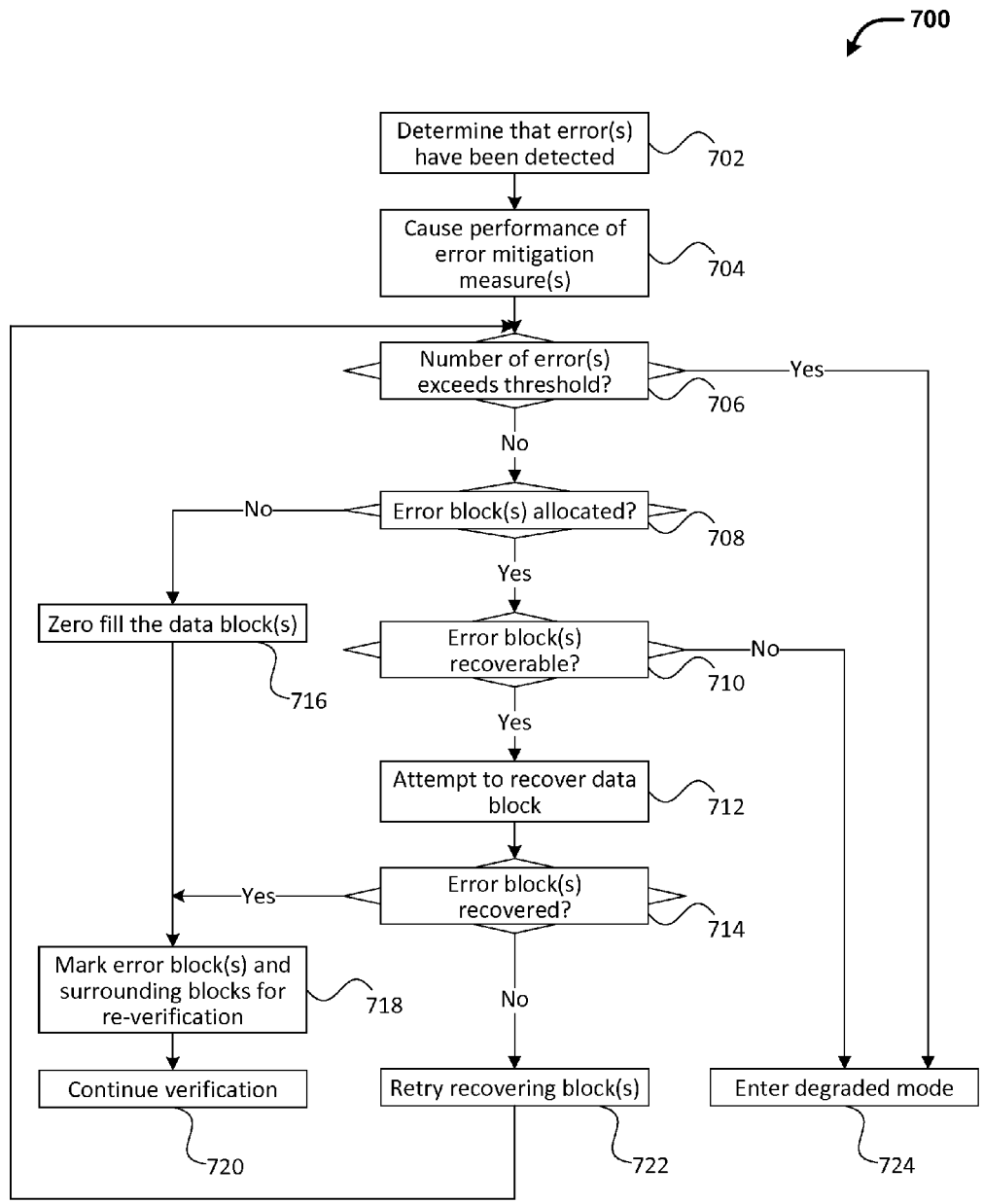
FIG. 7 illustrates an example process for performing error mitigation and correction, in accordance with at least one embodiment.

FIG. 7 illustrates an example process 700 for performing error mitigation and error correction operations, in accordance with at least one embodiment. Any or all aspects of process 700 may be performed separately or in combination with an error detection process, such as illustrated by process 300, by the same or a different entity than an entity that implements process 300, such as one or more verifiers 112 shown in FIG. 1 and/or one or more components of a distributed program execution service 200 shown in FIG. 2. In some embodiments, error mitigation and/or correction may be performed whenever an error or a certain number of errors have been detected. In other embodiments, error mitigation and/or correction may be performed during or at the end of or after at least some of the verification passes. In yet other embodiments, error mitigation and/or correction may be performed on a periodic basis or based on configurable information. In various embodiments, a system implementing process 700 may perform only error mitigation, only error correction or both.

To start with, process 700 may include determining 702 that one or more error(s) have been detected, for example, by error detection methods described herein. In an embodiment, such determination 702 may be made based at least in part on information contained in a request, a message, log file, a data store or any other similar source of information.

In some embodiments, process 700 may include causing 704 the performance of one or more error mitigation measures. Such error mitigation measures may include preventing a data storage entity that contains the error from competing aggressively for mastership of data volumes, for example, by increasing the wait period and/or time limits for taking and/or keeping mastership of the volumes. In some cases, a more drastic measure may be required that may have a significant impact on one or more performance characteristics (e.g., availability, throughput). For example, the data storage entity may refuse to accept new volumes and/or entering into a degraded mode to facilitate the isolation and/or fixing of the error or to allow the system to fail gracefully. In such cases, permission may be required, for example, from one or more services (e.g., load balancer, traffic reduction service) to reduce otherwise manage system load or traffic, the rate at which incoming requests are handled and the like. In some embodiments, mitigation measures as described herein may be performed for a predetermined and/or configurable period of time or until the occurrence of some event, such as until some or all of the detected errors have been fixed, until it is determined that some or all of the errors are uncorrectable, until intervention by other processes or a system administrator. In some embodiments, mitigation measures may be performed for an arbitrary period of time.

In some embodiments, process 700 may include determining 706 whether the total number of errors detected exceeds a predefined threshold. In some cases, one or more threshold values may be defined for various different types of errors. For example, the threshold for a minor error may be larger than a threshold for a more severe type of error. In some embodiments, the threshold may be determined based at least in part on analysis of failure characteristics associated with one or more data storage entities or statistical analysis of historical data. If the threshold value is exceeded, in some embodiments, process 700 may include causing 724 one or more data storage entities (e.g., data servers, data centers) to enter into a diagnostic/isolate mode to facilitate the isolation and/or fixing of the errors. Otherwise, if the threshold has not been exceeded, process 700 may include performing error correction operations as described below.

In various embodiments, the error correction operations may be performed on a block by block basis or on a group or collection of error blocks. As described above, an error block is a data block where an error is detected. As discussed above, in some embodiments, error correction may involve writing and/or relocating data. In some embodiments, process 700 may include determining 708 whether one or more error blocks are in an allocated area. If no, in some embodiments, process 700 may include zero-filling 716 the one or more error blocks. In general, any predefined or random data may be written to the one or more error blocks. Otherwise, if the error blocks are in an allocated area, process 700 may include determining 710 whether the one or more error blocks may be recoverable, for example, from one or more alternative data access locations such as a backup storage (e.g., slave drive), snapshot data store or data redundancy storage. If yes, process 700 may include attempting 712 to recover the error block from such alternative data access location(s). In some embodiments, one or more data storage entities (e.g., slave drive, high durability data store) may be searched, in any predetermined or arbitrary order, for an uncorrupted copy of the error block.

In some embodiments, process 700 may include determining 714 whether the one or more error blocks have been recovered 714, for example, from an alternative data access location. If yes, process 700 may include storing the retrieved data at the same or a different location than the one or more error blocks. For example, if an error is caused by physical damage to a data block of a data storage entity, recovered data may be stored to a different part of the data storage entity. On the other hand, if the error is caused by a write failure that does not physically damage the data block, the same data block may be overwritten with recovered data.

In some embodiments, process 700 may include marking one or more error block(s) and surrounding blocks for re-verification, for example, in a subsequent verification pass. In some embodiments, this may be implemented by using a data structure such as a bit array that represents the data blocks on a data storage entity. For example, a "1" in an element of a bit array may indicate that an error is detected at or near the data block that corresponds to the element, whereas a "0" indicates that no error is detected. Such markings may be used, in some embodiments, to update probabilities associated with the error blocks and surrounding blocks to facilitate verification in a subsequent verification pass. In some embodiments, process 700 may include continuing 720 verification of a next data block, if any.

If it is determined 714 that one or more error blocks cannot be recovered even though they are determined 710 to be recoverable, attempts may be made to retry 722 recovering the blocks before looping back to decision block 706 to repeat the error correction routine described above. In some embodiments, the retry attempts may be made for a predefined number of times and/or after a predetermined interval of time. In some embodiments, when errors are determined 710 to be unrecoverable, one or more data storage entities containing the errors may enter into a degraded mode and/or an error log/message may be provided to facilitate the isolation and/or correction of the errors or to allow the system to fail in a graceful fashion. In some embodiments, other error mitigation and/or correction mechanisms known to a person of ordinary skills in the art may be provided.

Variations of aspects of methods and systems described above are also considered as being within the scope of the present disclosure. For example, in some embodiments, verification passes as described herein may be performed sequentially or in parallel in a staggered fashion across multiple portions of a data storage entity or multiple data storage entities. For example, one or more verifications may be performed alternately between a master data storage entity and a slave data storage entity, only on the master data storage entity or only on the slave data storage entity. As another example, importance factors described herein may be used in any situation where the relative importance or priority of data is to be determined. For example, the importance factors may be used to determine which data to transfer, for example, between a low latency data store and a high durability data store such as described in connection with FIG. 2.

Figure 8:
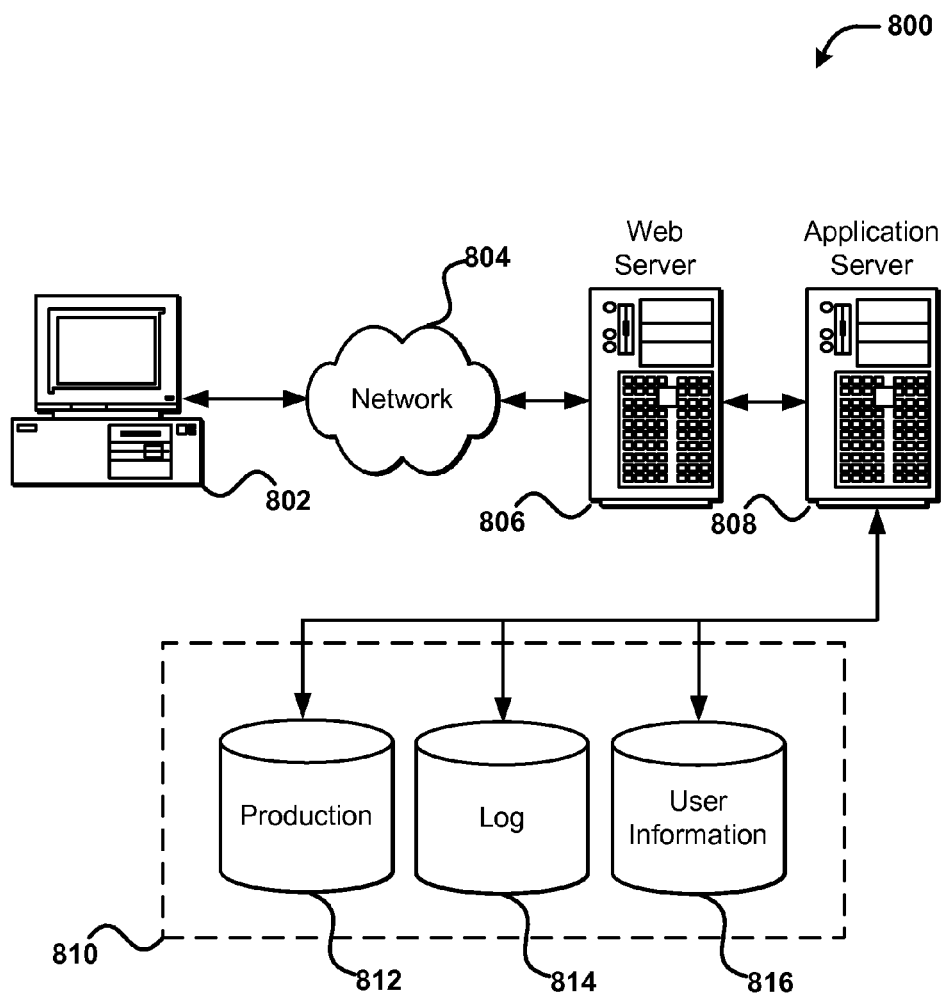
FIG. 8 illustrates aspects of an example environment 800 for implementing aspects in accordance with various embodiments.

FIG. 8 illustrates aspects of an example environment 800 for implementing aspects in accordance with various embodiments. As will be appreciated, although a Web-based environment is used for purposes of explanation, different environments may be used, as appropriate, to implement various embodiments. The environment includes an electronic client device 802, which can include any appropriate device operable to send and receive requests, messages or information over an appropriate network 804 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store, and is able to generate content such as text, graphics, audio and/or video to be transferred to the user, which may be served to the user by the Web server in the form of HTML, XML or another appropriate structured language in this example. The handling of all requests and responses, as well as the delivery of content between the client device 802 and the application server 808, can be handled by the Web server. It should be understood that the Web and application servers are not required and are merely example components, as structured code discussed herein can be executed on any appropriate device or host machine as discussed elsewhere herein.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log data 814, which can be used for reporting, analysis or other such purposes. It should be understood that there can be many other aspects that may need to be stored in the data store, such as for page image information and to access right information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user, and can access the catalog detail information to obtain information about items of that type. The information then can be returned to the user, such as in a results listing on a Web page that the user is able to view via a browser on the user device 802. Information for a particular item of interest can be viewed in a dedicated page or window of the browser.

Each server typically will include an operating system that provides executable program instructions for the general administration and operation of that server, and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature, and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIFS and AppleTalk. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A computer-implemented method for detecting errors in stored data, the data stored in non-transitory computer-readable storage media, comprising:
   under the control of one or more computer systems configured with executable instructions,
   associating each data block in a set of data blocks with a respective probability, the respective probability corresponding to the likelihood that the associated data block will be selected for verification during a verification pass;
   performing one or more verification passes to verify each data block in the set of data blocks based on one or more configurable verification parameters, each of the one or more verification passes comprising:
      selecting, based on a set of probabilities, a first subset of data blocks;
      verifying the first subset of data blocks; and
      updating each respective probability by redistributing a sum of probabilities associated with the first subset of data blocks among the respective probabilities, the redistribution being non-uniform and based on one or more of usage information, verification information, and a storage characteristic associated with a second subset of data blocks.

2. The computer-implemented method of claim 1, wherein the usage information includes at least a data access pattern.

3. The computer-implemented method of claim 1, wherein the verification information includes at least one of a verification status of a data block, verification time for one or more data blocks, or proximity between a first data block and a second data block where an error is detected in the second data block.

4. The computer-implemented method of claim 1, wherein the storage characteristics include at least whether a data block is allocated for a data volume, whether a data block is redundantly stored and one or more operational characteristics associated with a data storage entity.

5. The computer-implemented method of claim 1, wherein the one or more configurable verification parameters comprises a rate at which data is verified and one or more weight values usable for calculating a probability.

6. The computer-implemented method of claim 1, further comprising performing, after detection of an error in a data block of the plurality of data blocks, an error correction routine on the data block based at least in part on an allocation status of the data block.

7. The computer-implemented method of claim 1, wherein at least some of the one or more verification passes are performed in parallel with one or more customers' access to data stored in the set of data blocks.

8. A computer-implemented method of verifying data stored in non-transitory computer-readable data storage media, comprising:
under the control of one or more computer systems configured with executable instructions,
performing one or more verification passes to verify each data block in a plurality of data blocks stored in one or more data storage media, each of the one or more verification passes comprising:
verifying integrity of data blocks of a subset of the plurality of data blocks, the subset being selected based at least in part on a set of importance factors comprising usage information and verification information for the plurality of data blocks; and
responsive to selecting the data blocks of the subset, updating probabilities associated with the plurality of data blocks at least in part by non-uniformly redistributing probabilities associated with the data blocks of the subset among the probabilities associated with the plurality of data blocks.

9. The computer-implemented method of claim 8, wherein verifying integrity the data blocks of the subset of the plurality of data blocks includes reading the data blocks of the subset of the plurality of data blocks at no less than a configurable rate and checking integrity of one or more error-detection codes associated with the data blocks of the subset of the plurality of data blocks.

10. The computer-implemented method of claim 8, wherein verifying integrity the data blocks of the subset of the plurality of data blocks includes verifying that data stored in the data blocks of the subset of the plurality of data blocks is substantially the same as predefined data.

11. The computer-implemented method of claim 8, wherein the set of importance factors further comprises one or more failure characteristics associated with at least one of the one or more data storage media.

12. The computer-implemented method of claim 8, wherein each of the one or more verification passes further comprises updating at least some of the one or more importance factors.

13. The computer-implemented method of claim 8, further comprising updating, based at least in part on a result associated with at least one of the one or more verification passes, at least one of one or more verification parameters to improve one or more performance characteristics, wherein each of the one or more verification passes is performed based at least in part on the one or more verification parameters.

14. The computer-implemented method of claim 8, wherein at least one of the one or more verification passes is performed in parallel with concurrent customer access to data stored in the plurality of data blocks.

15. A computer system for identifying important data to verify, comprising:
one or more processors; and
memory, including instructions executable by the one or more processors to cause the computer system to:
perform one or more verification passes to verify data blocks, the data blocks comprising a first data block associated with a first probability and a second data block associated with a second probability, each of the one or more verification passes comprising:
selecting a subset of the data blocks, the selection of the subset of the data blocks based on a subset of probabilities;
verifying the subset of data blocks, and
updating the first probability and the second probability at least in part by non-uniformly redistributing one or more probabilities associated with the first data block among the data blocks.

16. The computer system of claim 15, wherein, for each of the one or more verification passes, an average of probabilities associated with the data blocks remains substantially the same before and after updating the first probability and the second probability.

17. The computer system of claim 15, wherein each of the one or more verification passes further comprises verifying integrity of the subset of data blocks.

18. The computer system of claim 15 wherein updating the first probability comprises decreasing the first probability when the first data block is verified and increasing the probability when the first data block is unverified.

19. The computer system of claim 15, wherein updating the first probability comprises increasing the first probability based on a proximity from the first data block to a third data block when an error is detected at the third data block.

20. The computer system of claim 15, wherein the instructions further cause the computer system to compete less aggressively for mastership of data volumes if an error is detected and to enter into a degraded mode if at least a predefined number of errors have been detected.

21. The computer system of claim 15, wherein at least some of the one or more verification passes are performed concurrently with customer access to data stored in the data blocks.

22. One or more non-transitory computer-readable storage media having stored thereon executable instructions that, when executed by one or more processors of a computer system, cause the computer system to at least:
perform multiple verifications of integrity of a plurality of data blocks that are associated with a plurality of importance indicators such that each data block is associated with a respective importance indicator, each verification of the multiple verifications comprising:
selecting, based on one or more of the plurality of importance indicators, a subset of the plurality of data blocks;
verifying data blocks of the selected subset; and
updating individual importance indicators at least in part by non-uniformly redistributing importance indicator values associated with the selected subset among the plurality of importance indicators of the plurality of data blocks.

23. The one or more computer-readable storage media of claim 22, wherein one or more importance indicators respectively associated with one or more of the plurality of data blocks are updated between the multiple verifications based at least in part on real-time usage information or verification information related to the plurality of data blocks.

24. The one or more computer-readable storage media of claim 22, wherein importance indicator for at least one of the plurality of the data blocks is based at least in part on whether data stored in the data block is redundantly stored.

25. The one or more computer-readable storage media of claim 22, wherein at least one of the multiple verifications is performed alternately between a master data storage entity and a slave data storage entity.

26. The one or more computer-readable storage media of claim 22, wherein the executable instructions further cause the computer system to:
   in response to detection of an error in a data block in a data storage entity, take one or more mitigation measures to reduce negative impact of the error at least by limiting further storage of data on the data storage entity.

27. The one or more computer-readable storage media of claim 22, wherein the executable instructions further cause the computer system to:
   in response to detection of an error in a data block, recover data stored in the data block from one or more alternative data access locations.

28. The one or more computer-readable storage media of claim 22, wherein at least some of the multiple verification passes are performed concurrently with customer access to data stored in the plurality of data blocks.

* * * * *